United States Patent
Reagan et al.

(10) Patent No.: US 9,209,598 B1
(45) Date of Patent: Dec. 8, 2015

(54) COOLING SYSTEM FOR HIGH AVERAGE POWER LASER

(71) Applicants: Brendan A. Reagan, Fort Collins, CO (US); Jorge J. Rocca, Fort Collins, CO (US); Keith A. Wernsing, Fort Collins, CO (US); Alden H. Curtis, Los Alamos, NM (US); Federico J. Furch, Berlin (DE)

(72) Inventors: Brendan A. Reagan, Fort Collins, CO (US); Jorge J. Rocca, Fort Collins, CO (US); Keith A. Wernsing, Fort Collins, CO (US); Alden H. Curtis, Los Alamos, NM (US); Federico J. Furch, Berlin (DE)

(73) Assignee: COLORADO STATE UNIVERSITY RESEARCH FOUNDATION, Fort Collins, CO (US)

( * ) Notice: Subject to any disclaimer, the term of this patent is extended or adjusted under 35 U.S.C. 154(b) by 0 days.

(21) Appl. No.: 13/714,193

(22) Filed: Dec. 13, 2012

Related U.S. Application Data

(60) Provisional application No. 61/570,415, filed on Dec. 14, 2011.

(51) Int. Cl.
*H01S 3/04* (2006.01)
*H01S 5/024* (2006.01)
*H01L 23/34* (2006.01)

(52) U.S. Cl.
CPC .............. *H01S 5/024* (2013.01); *H01L 23/34* (2013.01); *H01S 3/0407* (2013.01); *H01S 5/02407* (2013.01)

(58) Field of Classification Search
CPC ..... H01S 3/0407; H01S 3/042; H01S 3/0604; H01S 3/025; H01S 3/0404; H01S 3/1618; H01S 3/1643; H01S 3/2316; H01S 5/02469; H01S 5/02476
USPC ............................................................ 372/35
See application file for complete search history.

(56) References Cited

U.S. PATENT DOCUMENTS

| | | | | |
|---|---|---|---|---|
| 4,075,869 A | * | 2/1978 | Fitsall ............................. | 62/374 |
| 4,888,956 A | * | 12/1989 | le Roux Murray ............ | 62/51.1 |
| 5,477,691 A | * | 12/1995 | White ............................ | 62/50.2 |
| 5,982,792 A | * | 11/1999 | Kasamatsu et al. ............ | 372/35 |
| 6,195,372 B1 | * | 2/2001 | Brown ........................... | 372/34 |
| 6,354,087 B1 | * | 3/2002 | Nakahara et al. .................. | 62/6 |
| 6,912,858 B2 | * | 7/2005 | White ........................... | 62/50.5 |
| 7,869,469 B1 | * | 1/2011 | Spuler .............................. | 372/3 |
| 2001/0001004 A1 | * | 5/2001 | Lubrano ......................... | 372/35 |
| 2003/0231667 A1 | * | 12/2003 | Byren et al. .................... | 372/35 |
| 2006/0083276 A1 | * | 4/2006 | Brown ........................... | 372/36 |
| 2007/0297469 A1 | * | 12/2007 | Brown ........................... | 372/34 |
| 2011/0308259 A1 | * | 12/2011 | Wray et al. ...................... | 62/3.3 |

OTHER PUBLICATIONS

Richardson et al., "Cryogenic Engineering of High Temperature Superconductors Below 77 K," Cryogenics, 1995 vol. 35, No. 6, pp. 387-391.

* cited by examiner

*Primary Examiner* — Xinning Niu
*Assistant Examiner* — Vu A Vu
(74) *Attorney, Agent, or Firm* — Samuel M. Freund; Cochran Freund & Young LLC

(57) ABSTRACT

A cryogenic cooling apparatus for high average power laser oscillator or amplifier, wherein the oscillator or amplifier material is in direct contact with a flowing cryogenic liquid cooled to below its boiling point is described. This method of cooling overcomes the limit in heat flux due to the onset of film boiling, thereby allowing for increased laser average power.

18 Claims, 5 Drawing Sheets

COOLING SYSTEM FOR HIGH AVERAGE POWER LASER

RELATED CASES

The present patent application claims the benefit of Provisional Patent Application Ser. No. 61/570,415 filed on 14 Dec. 2011 entitled "High Energy High Power Laser Amplifier" by Brendan A; Reagan et al., the disclosure and teachings of which are hereby incorporated by reference herein.

STATEMENT REGARDING FEDERAL RIGHTS

This invention was made with government support under Grant No. EEC0310717 awarded by the National Science Foundation. The government has certain rights in the invention.

FIELD OF THE INVENTION

The present invention relates generally to laser oscillators and amplifiers and, more particularly, to cryogenically-cooled, high average power laser oscillators and amplifiers.

BACKGROUND OF THE INVENTION

There is significant interest in developing high pulse energy (Joules) and high average power diode-pumped solid state lasers for applications where a low energy laser pulse is amplified by one or more amplifiers to achieve high pulse energy. The active medium in such amplifiers is a solid material which is optically excited or pumped by light from a laser diode array or other source of light, whereby energy is stored and gain is produced. A portion of the pump energy is locally converted to heat within the material, thereby limiting average power of these amplifiers as a result of the onset of thermal effects due to thermal gradients within the amplifier material, such as thermal lensing, thermal birefringence or, in some materials, a reduction of gain from excessive heating.

A number of amplifier geometries have been developed for efficiently cooling these amplifiers and mitigate the above effects including: the zig-zag slab geometry in which thermal aberrations are somewhat cancelled, the active mirror geometry in which the lasing medium is cooled through one face resulting in high cooling capacity and non-aberration causing longitudinal thermal gradients, and the thin disk approach in which the laser material is made to be very thin allowing highly efficient heat removal.

Operation at cryogenic temperatures is known to significantly improve the thermal characteristics of some laser materials including titanium sapphire and Yb:YAG. The thermal conductivity of Yb:YAG, to which all average power-limiting thermal effects scale inversely, increases approximately a factor of 7-10 when cooled to the boiling temperature of liquid nitrogen, 77 K. Additionally, the thermo-optic and expansion coefficients are both significantly decreased at low temperatures, and the stimulated emission cross section, which partially determines the gain of the material, is increased at cryogenic temperature, thereby allowing efficient energy extraction at non-damaging laser intensities.

Cryogenic cooling of laser materials is typically accomplished either by heat transfer through direct contact with boiling liquid nitrogen, or through conduction to a cryogenically-cooled heat sink. In the latter, the laser material is either soldered or otherwise placed in thermal contact with a conductive heat sink, typically made of copper, that is cooled to cryogenic temperature by liquid nitrogen boiling or by a closed-cycle cryostat. For large area disks required for high-energy amplifiers, the mismatch in thermal expansion between the laser material and heat sink may result in large deformations in the laser material when cooled to cryogenic temperatures in a similar manner to that for bimetallic materials. Such deformations cause deterioration of beam quality, which is unacceptable for most applications. Additionally, the use of any material between the laser material and the cooling source results in an increase in temperature due to conduction within the heat sink.

Direct, boiling heat transfer through contact with a cryogenic fluid, usually liquid nitrogen, can avoid the problems of laser material deformations from soldering to a copper heat sink, and temperature increase due to conduction within the heat sink. However, the maximum heat power flux that can be dissipated through this technique is limited by the transition from the nucleate boiling regime to the film boiling regime. At low and moderate thermal fluxes, thermal power is transferred to the boiling liquid through nucleate boiling characterized by the formation of small bubbles which rapidly leave the liquid-solid interface. As the thermal flux is increased, a thin layer of vapor may form over the interface effectively shielding the solid surface from the liquid coolant, and significantly reducing heat transfer efficiency. This effect is known as film boiling, and the thermal flux at the onset of film boiling is referred to as the critical heat flux. The critical heat flux of liquid nitrogen at atmospheric pressure is about 20 $W/cm^2$, which limits the average power of such laser amplifiers. At heat fluxes above this value, the temperature of the cooling surface is substantially raised.

SUMMARY OF THE INVENTION

Embodiments of the present invention overcome the disadvantages and limitations of the prior art by providing an apparatus for cryogenically cooling laser oscillator or amplifier material without film boiling.

Another object of the present invention is to provide a laser apparatus having a cryogenic liquid cooled oscillator or amplifier.

Additional objects, advantages and novel features of the invention will be set forth in part in the description which follows, and in part will become apparent to those skilled in the art upon examination of the following or may be learned by practice of the invention. The objects and advantages of the invention may be realized and attained by means of the instrumentalities and combinations particularly pointed out in the appended claims.

To achieve the foregoing and other objects, and in accordance with the purposes of the present invention, as embodied and broadly described herein, an embodiment of the apparatus for cryogenically cooling solid-state laser oscillator or amplifier material hereof, includes: a heat exchanger for cooling a cryogenic liquid to a chosen temperature below its boiling point; a cooling head having an opening to which the oscillator or amplifier material is sealed, a cryogenic liquid inlet and a cryogenic liquid outlet for permitting the cryogenic liquid to flow passed and contact the oscillator or amplifier material; a pump for flowing the cooled cryogenic liquid through said cooling head; a chamber capable of being evacuated to a chosen vacuum having an anti-reflecting window spaced-apart from and parallel to the second face of the laser amplifier material, for surrounding the cooling head and the laser amplifier material sealed thereto; and a vacuum pump for evacuating the chamber.

In another aspect of the present invention and in accordance with its objects and purposes, an embodiment of the apparatus for generating amplified laser radiation hereof, includes: solid-state laser amplifier material; a heat exchanger for cooling a cryogenic liquid to a chosen temperature below its boiling point; a cooling head having an opening to which the amplifier material is sealed, a cryogenic liquid inlet and a cryogenic liquid outlet for flowing the cryogenic liquid passed and in contact with the amplifier material; a pump for flowing the cooled cryogenic liquid through the cooling head; a pump laser or pump amplifier for generating laser radiation having a first chosen wavelength of light such that the amplifier material generates amplified laser radiation having a second chosen wavelength in response to laser radiation of the first chosen wavelength interacting therewith; a chamber capable of being evacuated to a chosen vacuum having a window spaced-apart from the amplifier material, for surrounding the cooling head and the laser amplifier material sealed thereto, the window capable of transmitting wavelengths corresponding to the pump laser wavelength and the amplified laser wavelength; and a vacuum pump for evacuating the chamber.

In yet another aspect of the present invention and in accordance with its objects and purposes, an embodiment of the apparatus for generating amplified laser radiation hereof, includes: solid-state laser amplifier material having a first reflective flat face and a second anti-reflection flat face spaced-apart from and parallel to the first face; a heat exchanger for cooling a cryogenic liquid to a chosen temperature below its boiling point; a cooling head having an opening to which the first flat face of the amplifier material is sealed, a cryogenic liquid inlet and a cryogenic liquid outlet for flowing the cryogenic liquid passed and in contact with the first face of the amplifier material; a pump for flowing the cooled cryogenic liquid through the cooling head; a pump laser or pump amplifier for generating laser radiation having a first chosen wavelength of light such that the amplifier material generates amplified laser radiation having a second chosen wavelength in response to laser radiation of the first chosen wavelength interacting therewith; a chamber capable of being evacuated to a chosen vacuum having an anti-reflecting window spaced-apart from and parallel to the second face of the laser amplifier material, for surrounding the cooling head and the laser amplifier material sealed thereto, the anti-reflecting window capable of transmitting wavelengths corresponding to the pump laser wavelength and the amplified laser wavelength; and a vacuum pump for evacuating the chamber.

Benefits and advantages of embodiments of the present invention include, but are not limited to, providing an apparatus and method for cryogenically cooling solid-state laser amplifier material, which has superior properties at low temperatures, while eliminating film boiling which significantly reduces heat transfer efficiency.

BRIEF DESCRIPTION OF THE DRAWINGS

The accompanying drawings, which are incorporated in and form a part of the specification, illustrate embodiments of the present invention and, together with the description, serve to explain the principles of the invention. In the drawings.

DETAILED DESCRIPTION OF THE INVENTION

Briefly, embodiments of the present invention include a cooling system for a high energy, high average power "thick-disk" laser amplifier which places the amplifier in direct contact with a cryogenically-cooled flowing liquid cooled to below its boiling point. The laser material or medium may be any solid-state laser host material in which properties are improved at cryogenic temperature including but not limited to: yttrium lithium fluoride (YLF), yttrium aluminum garnet (YAG), sapphire ($Al_2O_3$), calcium fluoride ($CaF_2$), or combinations of several materials.

Figure 1:
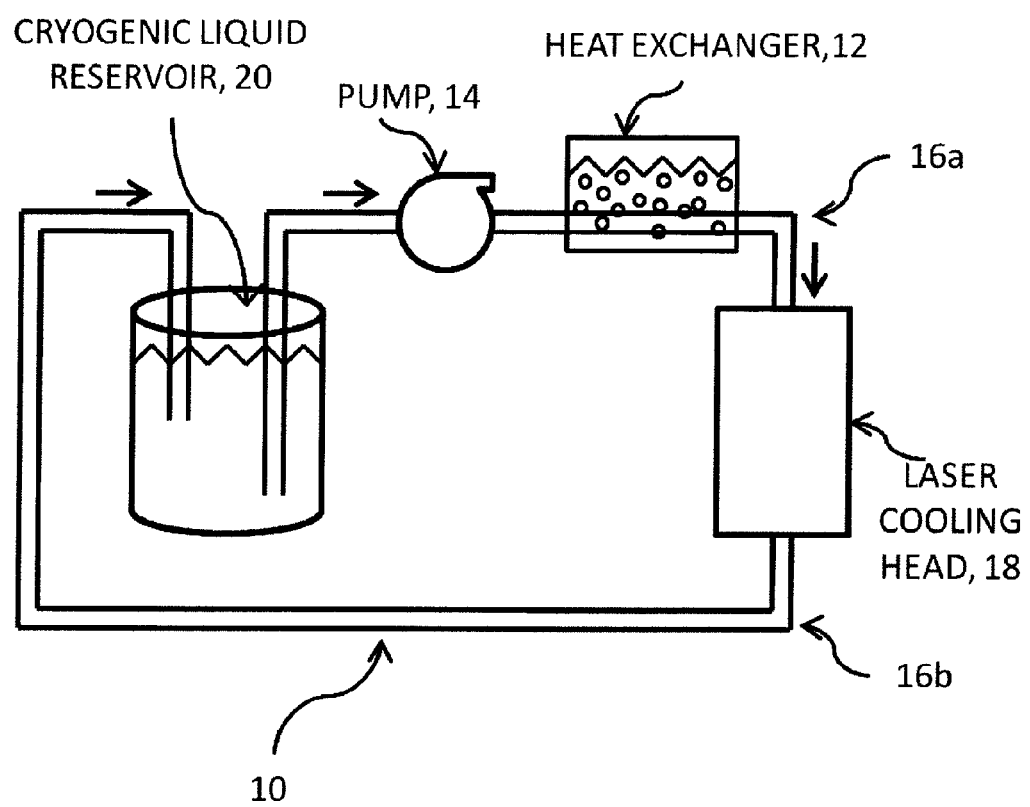
FIG. 1 is a schematic representation of an embodiment of the cryogenic cooling system for laser amplifier material of the present invention, illustrating liquid oxygen being pumped through a liquid nitrogen-cooled heat exchanger cooling it to about 77 K, the liquid oxygen being cooled to below its boiling point before being pumped through vacuum jacketed lines to the amplifier material cooling apparatus where it directly cools the laser amplifier material, after which the liquid oxygen is returned to a reservoir which is also cooled by liquid nitrogen.

Reference will now be made in detail to the present embodiments of the invention, examples of which are illustrated in the accompanying drawings. In the FIGURES, similar structure will be identified using identical reference characters. It will be understood that the FIGURES are presented for the purpose of describing particular embodiments of the invention and are not intended to limit the invention thereto. Turning now to FIG. 1, shown is a schematic representation of an embodiment of cryogenic cooling system, 10, for laser amplifier material of the present invention, illustrating liquid oxygen (which has a boiling temperature of 90 K and a freezing temperature of 54 K at atmospheric pressure), as an example, being circulated through liquid nitrogen-cooled heat exchanger, 12, by pump, 14, where it is cooled it to about 77 K, well below its boiling temperature, using boiling liquid nitrogen or by other means, the liquid oxygen being cooled to below its boiling temperature, before being circulated through vacuum jacketed lines, 16a, and, 16b, to amplifier material cooling apparatus, 18, where it directly cools the laser amplifier material by conduction, after which the liquid oxygen is returned to reservoir, 20, which is also cooled by liquid nitrogen, not shown in FIG. 1. The cryogenic flow maintained at a rate sufficient to ensure that the liquid is always below its boiling temperature, and therefore remains in a liquid state. Liquid nitrogen can be cooled to below its boiling temperature and used as a cryogenic coolant as may other liquefied gases, in accordance with the teachings of embodiments of the present invention.

Figure 2:
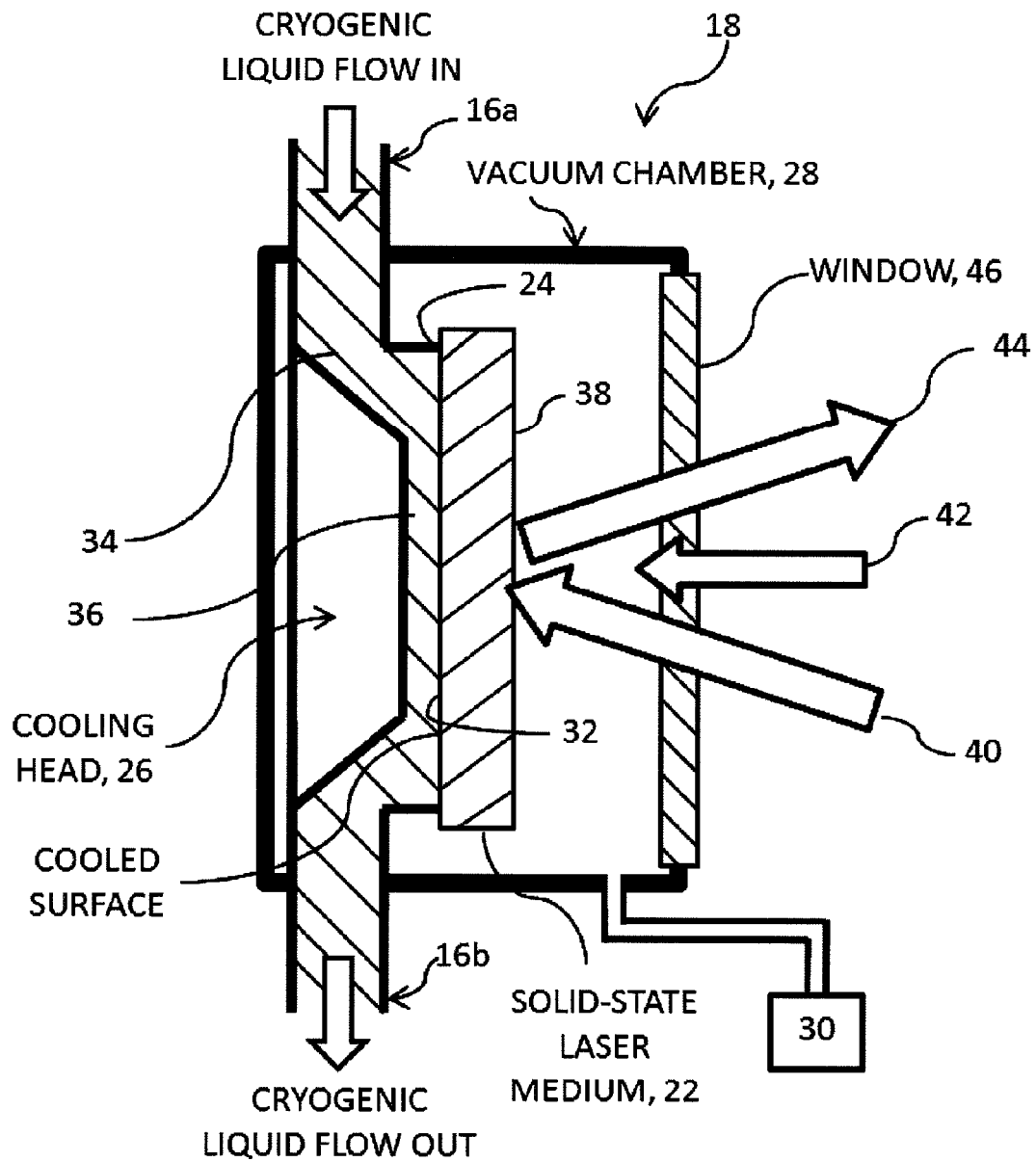
FIG. 2 is a schematic representation of a side view of an embodiment of the cooling mentioned in FIG. 1, hereof, illustrating a vacuum chamber surrounding the cooling head having cryogenic inlet and outlet tubes, and an opening to which the laser amplifier material is sealed such that the amplifier material is directly cooled by the cryogenic liquid, and a window for introducing seed and pump laser radiation to the laser amplifier material, and for permitting the amplified radiation to exit the vacuum chamber.

FIG. 2 is a schematic representation of oscillator or amplifier medium cooling apparatus 18, wherein active-mirror laser material, 22, is sealed to open face, 24, of cooling head, 26. Sealing may be achieved by many methods including soldering. Laser medium 22 may also be clamped (not shown in FIG. 2) to open face 24 of cooling head 26 using indium gasket material for achieving a seal. Chamber, 28, evacuated by vacuum pump, 30, encloses cooling head 26 and laser medium 22 to prevent condensation. Face, 32, of material 22 is cooled by direct contact with flowing cryogenic liquid, 34. Narrow channel, 36, and flow rate adjustment may be employed to make the flow turbulent to improve the efficiency of heat removal and to ensure that heat is evenly distributed in the cryogenic liquid. Face 32 is coated with a highly reflective material and opposing face, 38, spaced apart from and parallel to face 32 is anti-reflection coated for both seed laser beam, 40, and pump laser beam, 42. Amplified beam, 44, is also shown passing through anti-reflection coated window, 46, which may be fused silica, as an example, sealed to vacuum chamber 28. As the cooling capacity of the system can be increased by increasing the flow rate, the achievable average power is limited only by the physical parameters of the laser material and its geometry.

In addition to the "active mirror" thin disk or thick disk geometry in which the laser amplifier material includes a first reflective flat face in contact with the flowing cryogenic liquid and a second anti-reflection flat face spaced-apart from the first face, described hereinabove, the laser oscillator or amplifier material may have other geometrical configurations, including but not limited to: (1) generally rectangular cross section slab in which the cooling liquid is in contact with the lateral faces thereof; (2) an edge-cooled cylindrical, square, or rectangular rod where the cooling liquid is in contact with the outside edges of the material; (3) an optical fiber laser amplifier in which the cooling liquid is in contact with the cladding or core of the fiber laser amplifier; and (4) a "total internal reflection active mirror" (TRAM) geometry in which the laser amplifier material includes two transmitting surfaces and one cooled surface at an angle sufficient to support total internal reflection.

The active mirror geometry combined with improved thermal parameters at cryogenic temperature permits efficient heat removal with predominately longitudinal thermal gradients. Thin disk amplifiers, while having better geometry for efficient cooling, do not have sufficient energy storage efficiency for high energy amplifier applications, as a result of large amplified spontaneous emission (ASE) which accompanies high transverse gain amplifiers having small length to diameter ratio. By increasing the material thicknesses to several millimeters, high energy storage is achievable while maintaining a thermally efficient geometry.

Having generally described the present invention, the following EXAMPLE provides additional details.

Example

Figure 3:
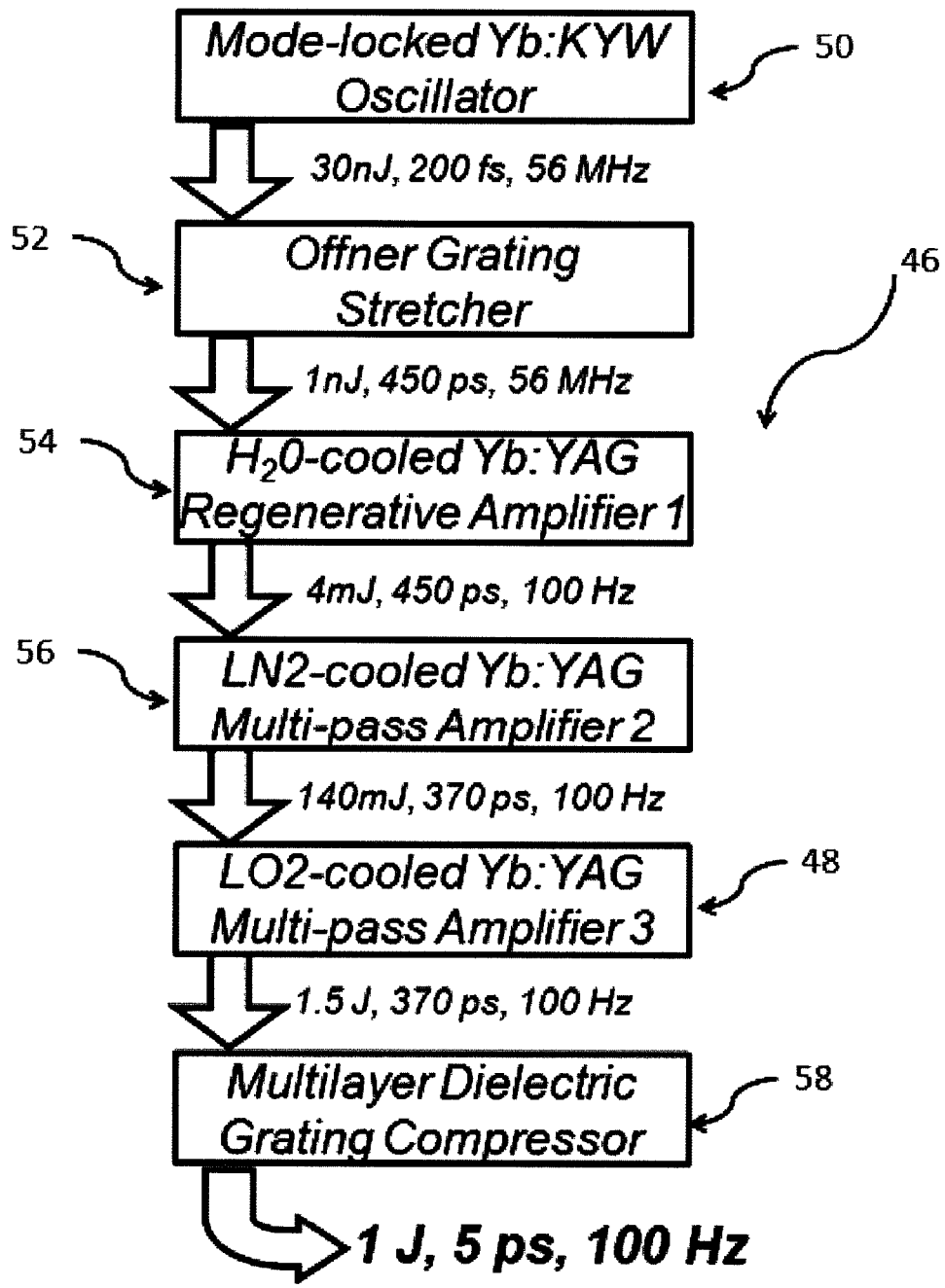
FIG. 3 is a schematic representation of a diode-pumped embodiment of a laser system in which a Yb:YAG amplifier cooled using liquid oxygen in accordance with the teachings of embodiments of the present invention is used.

FIG. 3 is a schematic representation of high-energy, all-diode-pumped, chirped pulse amplification system, 46, that produces Joule-level pulses at high repetition rates (100 Hz) in which liquid oxygen cooled, Yb:YAG laser power amplifier, 48, has been employed. Laser system 46 includes diode-pumped, mode-locked Yb:KYW oscillator, 50, grating pulse stretcher, 52, three stages of amplification, 54, 56, and 48, and pulse compressor, 58. Amplifier 54 is a room temperature Yb:YAG regenerative amplifier that amplifies the stretched seed pulses from oscillator 50 to the millijoule level. Amplifiers 56 and 48 are cryogenically-cooled Yb:YAG amplifiers. The use of a broad bandwidth room temperature Yb:YAG preamplifier combined with cryogenic power amplifiers permits exploitation of the high power characteristics of Yb:YAG at cryogenic temperatures without excessive gain narrowing in the preamplifier. The thick-disk active mirror second stage of amplification was used to amplify the pulses to 140 mJ at repetition rates up to 100 Hz. As stated, power amplifier 48 employs liquid oxygen cooling in accordance with embodiments of the present invention. Two 5.5 mm thick Yb:YAG crystals were mounted in vacuum on an invar amplifier cooling head, since invar has minimal thermal expansion mismatch with YAG when compared to other available metals. The YAG crystals were symmetrically contacted by the invar mount to reduce laser medium deformation.

A five pass Yb:YAG amplifier amplifies $\lambda=1030$ nm, 100 mJ seed pulses to 1.5 J at 100 Hz repetition rate. Subsequent pulse compression produced 1 J of 5 ps full-width-at-half-maximum (FWHM) pulse duration, at a repetition rate of 100 Hz. Two 5.5 nm thick Yb:YAG crystals, 22a, and, 22b, were each pumped with 4 kW, 1.5 ms duration $\lambda=940$ nm pump pulses from a laser diode array, not shown in FIG. 4. The crystals were mounted in vacuum on a single liquid oxygen cooled cooling head, where the liquid oxygen was cooled to below its boiling temperature. Seed pulses of ~100 mJ energy were directed by mirrors to make five double-passes through crystals 22a and 22b, after which an energy of 1.5 J was achieved.

Figure 4:
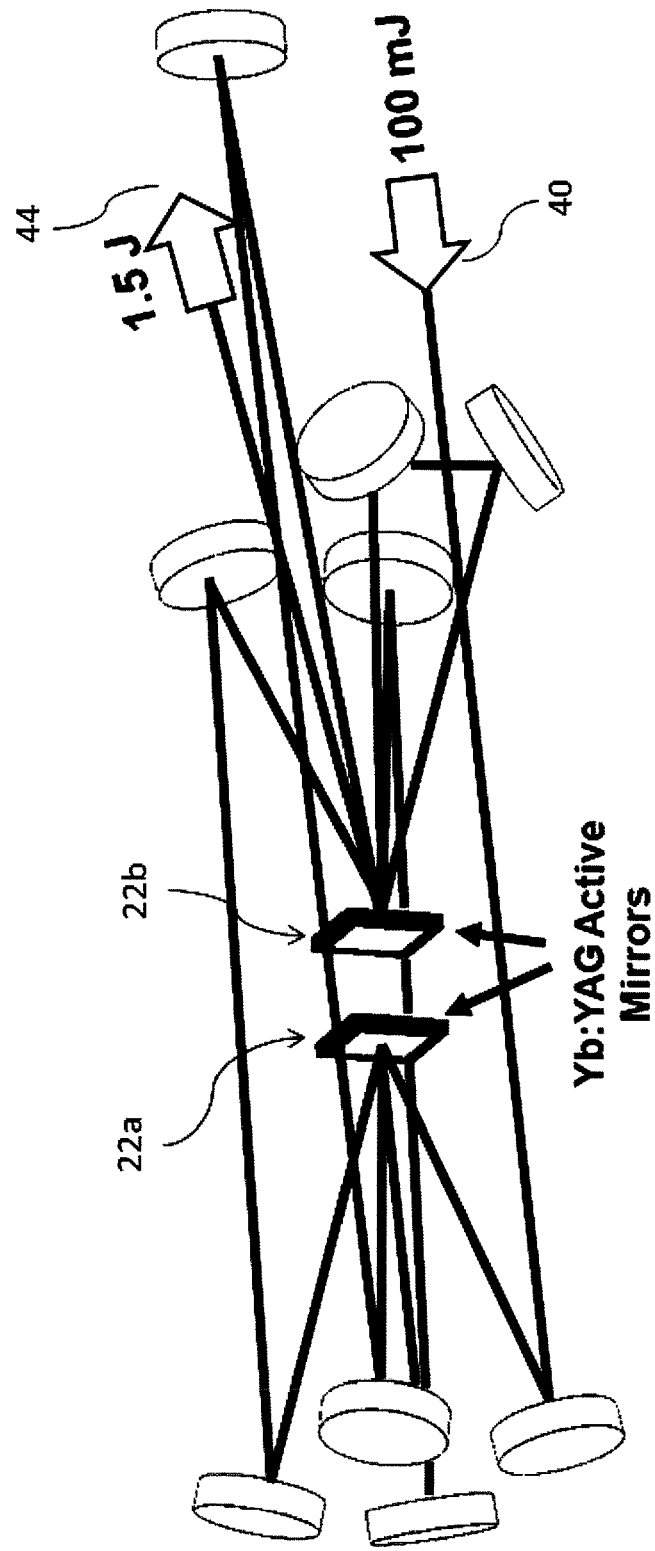
FIG. 4 is a schematic representation of a perspective view of an embodiment of a multipass, Joule-level Yb:YAG amplifier, with pump laser beams and optics, vacuum chamber, cooling block, and optical mounts being omitted for clarity, where 100 mJ pulses from a 2nd stage make a total of 5 passes through the two Yb:YAG crystals (two for the left crystal, three on the right crystal).
Figure 5:
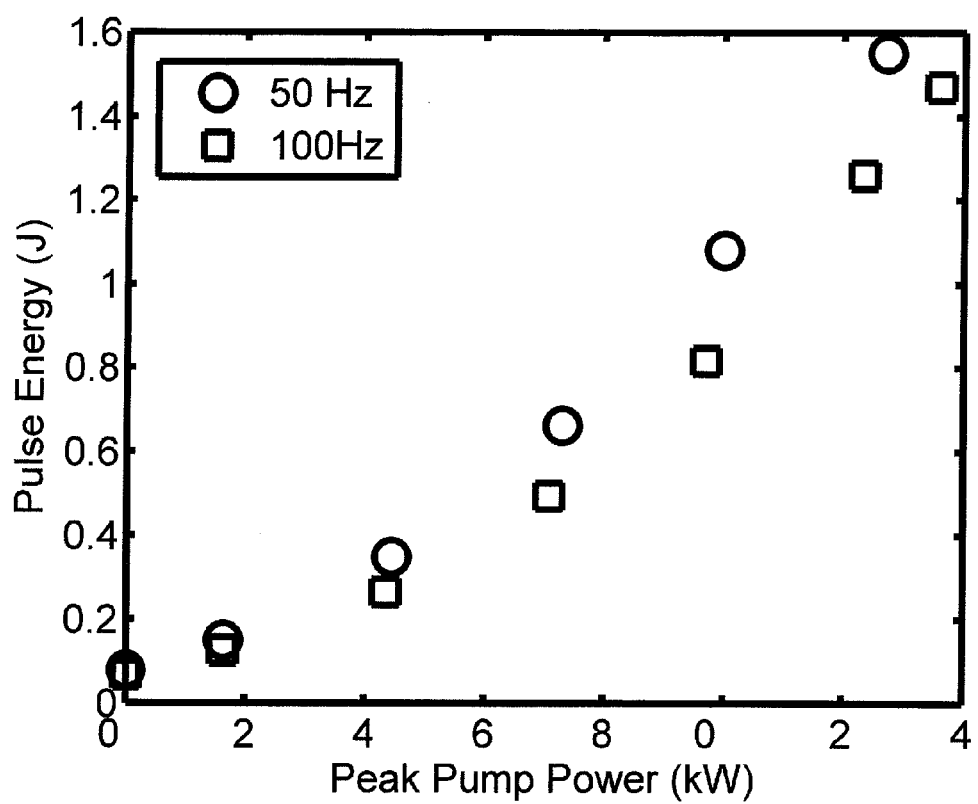
FIG. 5 is a graph of the output pulse energy of the 5-pass, Joule-level amplifier shown in FIG. 4, hereof, as a function of peak pump power at 50 Hz and 100 Hz repetition rates.

The output pulse energy obtained from the amplifier of FIG. 4 as a function of peak pump power is shown in FIG. 5 for repetition rates of 50 Hz (circles) and 100 Hz (squares). As stated above, at 100 Hz repetition rate, a pulse energy of 1.5 J was obtained with an optical to optical efficiency of about 15%.

The foregoing description of the invention has been presented for purposes of illustration and description and is not intended to be exhaustive or to limit the invention to the precise form disclosed, and obviously many modifications and variations are possible in light of the above teaching. The embodiments were chosen and described in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

What is claimed is:
1. Apparatus for cryogenically cooling solid-state laser oscillator or amplifier material, comprising: a heat exchanger using liquid nitrogen for cooling a cryogenic liquid to a chosen temperature below its boiling point and above its freezing temperature; a cooling head having an opening to which the first flat face of said oscillator or amplifier material is sealed, a cryogenic liquid inlet and a cryogenic liquid outlet for flowing the cryogenic liquid passed and in contact with said oscillator or amplifier material; a pump for flowing said cooled cryogenic liquid through said cooling head, at a rate sufficient to ensure that the cryogenic liquid remains below its boiling temperature throughout said entire apparatus; a chamber capable of being evacuated to a chosen vacuum, having a window spaced-apart from said laser oscillator or amplifier material, for surrounding said cooling head and said laser amplifier material sealed thereto; and a vacuum pump for evacuating said chamber.

2. The apparatus of claim 1, wherein the flow of cryogenic liquid passed and in contact with said laser amplifier material comprises turbulent flow.

3. The apparatus of claim 1, wherein said cryogenic liquid comprises liquid oxygen.

4. The apparatus of claim 1, wherein said laser amplifier material has a reflective first flat face in contact with the flowing cryogenic liquid, and an anti-reflection coated second flat face spaced apart from and parallel to the first flat face.

5. The apparatus of claim 4, further comprising a laser or amplifier for generating laser radiation having a first chosen wavelength of light; and a pump laser for generating amplifier material pumping radiation having a second chosen wavelength; whereby said amplifier material generates amplified laser radiation at the first wavelength in response to laser radiation of the first chosen wavelength and pumping radiation having a second chosen wavelength interacting therewith; and wherein said window in said chamber comprises an anti-reflecting window parallel to the second face of said laser amplifier material, and capable of transmitting wavelengths corresponding to the pumping laser wavelength and the seed wavelength.

6. The apparatus of claim 1, wherein said laser amplifier material is chosen from: yttrium lithium fluoride (YLF), yttrium aluminum garnet (YAG), sapphire ($Al_2O_3$), calcium fluoride ($CaF_2$), and mixtures thereof.

7. The apparatus of claim 1, wherein said laser amplifier material comprises YAG, and said cooling head comprises invar.

8. Apparatus for generating amplified laser radiation, comprising: solid-state laser amplifier material; a heat exchanger using liquid nitrogen for cooling a cryogenic liquid to a chosen temperature below its boiling point and above its freezing temperature; a cooling head having an opening to which said amplifier material is sealed, a cryogenic liquid inlet and a cryogenic liquid outlet for flowing the cryogenic liquid passed and in contact with said amplifier material; a pump for flowing said cooled cryogenic liquid through said cooling head, at a rate sufficient to ensure that the cryogenic liquid remains below its boiling temperature throughout said entire apparatus; a seed laser or seed amplifier for generating laser radiation having a first chosen wavelength of light; a pump laser for generating amplifier material pumping radiation having a second chosen wavelength; whereby said amplifier material generates amplified laser radiation having the first chosen wavelength in response to seed radiation of the first chosen wavelength and pumping laser radiation having a second chosen wavelength interacting therewith; a chamber capable of being evacuated to a chosen vacuum having a window spaced-apart from said laser amplifier material, for surrounding said cooling head and said laser amplifier material sealed thereto, said window capable of transmitting wavelengths corresponding to the seed laser wavelength and the pumping laser wavelength; and a vacuum pump for evacuating said chamber.

9. The apparatus of claim 8, wherein said laser amplifier material has a reflective first flat face in contact with the flowing cryogenic liquid, and an anti-reflection coated second flat face spaced apart from and parallel to the first flat face, and wherein said window in said chamber comprises an anti-reflecting window parallel to the second face of said laser amplifier material, and capable of transmitting wavelengths corresponding to the pumping laser wavelength and the seed wavelength.

10. The apparatus of claim 8, wherein the flow of cryogenic liquid passed and in contact with said laser amplifier material comprises turbulent flow.

11. The apparatus of claim 8, wherein said cryogenic liquid comprises liquid oxygen.

12. The apparatus of claim 8, wherein said laser amplifier material is chosen from: yttrium lithium fluoride (YLF), yttrium aluminum garnet (YAG), sapphire ($Al_2O_3$), calcium fluoride ($CaF_2$), and mixtures thereof.

13. The apparatus of claim 8, wherein said laser amplifier material comprises YAG, and said cooling head comprises invar.

14. Apparatus for generating amplified laser radiation, comprising: solid-state laser amplifier material having a first reflective flat face and a second anti-reflection flat face spaced-apart from and parallel to the first face; a heat exchanger using liquid nitrogen for cooling a cryogenic liquid to a chosen temperature below its boiling point and above its freezing temperature; a cooling head having an opening having flat borders adapted for sealing the first flat face of said amplifier material, a cryogenic liquid inlet and a cryogenic liquid outlet for flowing the cryogenic liquid passed and in contact with the with first face of said amplifier material; a pump for flowing said cooled cryogenic liquid through said cooling head, at a rate sufficient to ensure that the cryogenic liquid always remains below its boiling temperature throughout said entire apparatus; a seed laser or seed amplifier for generating laser radiation having a first chosen wavelength of light; a pump laser for generating amplifier material pumping radiation having a second chosen wavelength; whereby said amplifier material generates amplified laser radiation having the first chosen wavelength in response to seed radiation of the first chosen wavelength and pumping laser radiation having a second chosen wavelength interacting therewith; a chamber capable of being evacuated to a chosen vacuum having an anti-reflecting window spaced-apart from and parallel to the second face of said laser amplifier material, for surrounding said cooling head and said laser amplifier material sealed thereto, the anti-reflecting window capable of transmitting wavelengths corresponding to the seed laser wavelength and the pumping laser wavelength; and a vacuum pump for evacuating said chamber.

15. The apparatus of claim 14, wherein the flow of cryogenic liquid passed and in contact with said laser amplifier material comprises turbulent flow.

16. The apparatus of claim 14, wherein said cryogenic liquid comprises liquid oxygen.

17. The apparatus of claim 14, wherein said laser amplifier material is chosen from: yttrium lithium fluoride (YLF), yttrium aluminum garnet (YAG), sapphire ($Al_2O_3$), calcium fluoride ($CaF_2$), and mixtures thereof.

18. The apparatus of claim 14, wherein said laser amplifier material comprises YAG, and said cooling head comprises invar.

* * * * *